United States Patent
De Leon et al.

(10) Patent No.: US 10,181,718 B2
(45) Date of Patent: Jan. 15, 2019

(54) SURFACE-MOUNTABLE ELECTRICAL CIRCUIT PROTECTION DEVICE

(71) Applicant: LITTELFUSE, INC., Chicago, IL (US)

(72) Inventors: Conrado De Leon, Batangas (PH); Albert Enriquez, Batangas (PH); Editha Liquido, Laguna (PH); Crispin Zulueta, Batangas (PH)

(73) Assignee: Littelfuse, Inc., Chicago, IL (US)

( * ) Notice: Subject to any disclaimer, the term of this patent is extended or adjusted under 35 U.S.C. 154(b) by 350 days.

(21) Appl. No.: 14/995,881

(22) Filed: Jan. 14, 2016

(65) Prior Publication Data

US 2016/0218502 A1    Jul. 28, 2016

Related U.S. Application Data

(60) Provisional application No. 62/106,384, filed on Jan. 22, 2015.

(51) Int. Cl.
*H02H 9/04* (2006.01)
*H02H 9/00* (2006.01)
(Continued)

(52) U.S. Cl.
CPC ............ *H02H 9/04* (2013.01); *H02H 9/005* (2013.01); *H05K 1/0259* (2013.01);
(Continued)

(58) Field of Classification Search
CPC .......... H02H 9/005; H02H 9/04–9/041; H05K 9/0259; H05K 1/0259; H01L 27/0248
See application file for complete search history.

(56) References Cited

U.S. PATENT DOCUMENTS

| | | | |
|---|---|---|---|
| 6,108,184 A * | 8/2000 | Minervini | H01C 7/12 338/21 |
| 6,351,011 B1 * | 2/2002 | Whitney | H01C 7/12 257/355 |

(Continued)

FOREIGN PATENT DOCUMENTS

| | | |
|---|---|---|
| JP | 2004127615 A | 4/2004 |
| JP | 2010129923 A | 12/2011 |

(Continued)

*Primary Examiner* — Ronald W Leja
*Assistant Examiner* — Christopher Clark

(57) ABSTRACT

Provided herein are improved electrical circuit protection devices for protection against electrostatic discharge (ESD), the devices including a first support substrate, a first electrode and a second electrode formed on the first support substrate, wherein the first electrode and the second electrode are formed from a conductive material. The devices further include a first bonding pad disposed on the first and second electrode, the first bonding pad having a first cavity formed therein; a second support substrate disposed on the first bonding pad, the second support substrate having a second cavity formed therein, and a voltage variable material disposed within the first cavity and the second cavity and electrically connected to the first electrode and the second electrode. The devices further include a second bonding pad disposed on the second support substrate, and a third support substrate disposed on the second bonding pad.

18 Claims, 9 Drawing Sheets

(51) Int. Cl.
*H02K 1/02* (2006.01)
*H05K 1/02* (2006.01)
*H05K 1/03* (2006.01)

(52) U.S. Cl.
CPC ......... *H05K 1/0306* (2013.01); *H05K 1/0366* (2013.01); *H05K 2201/0154* (2013.01); *H05K 2201/0738* (2013.01)

(56) References Cited

U.S. PATENT DOCUMENTS

| | | | | |
|---|---|---|---|---|
| 8,847,726 B2 * | 9/2014 | Ikeda | .................. | H01T 4/12 |
| | | | | 338/21 |
| 2004/0034993 A1 * | 2/2004 | Rybka | .................. | H01C 1/1406 |
| | | | | 29/623 |
| 2007/0019354 A1 * | 1/2007 | Kamath | .................. | H01C 1/146 |
| | | | | 361/118 |
| 2011/0291785 A1 * | 12/2011 | Lim | .................. | H01F 27/2804 |
| | | | | 336/200 |
| 2014/0175638 A1 * | 6/2014 | Kim | .................. | H01L 21/6836 |
| | | | | 257/737 |

FOREIGN PATENT DOCUMENTS

| | | | |
|---|---|---|---|
| JP | 2013219019 A | 10/2013 | |
| JP | 2014192126 A | 10/2014 | |

* cited by examiner

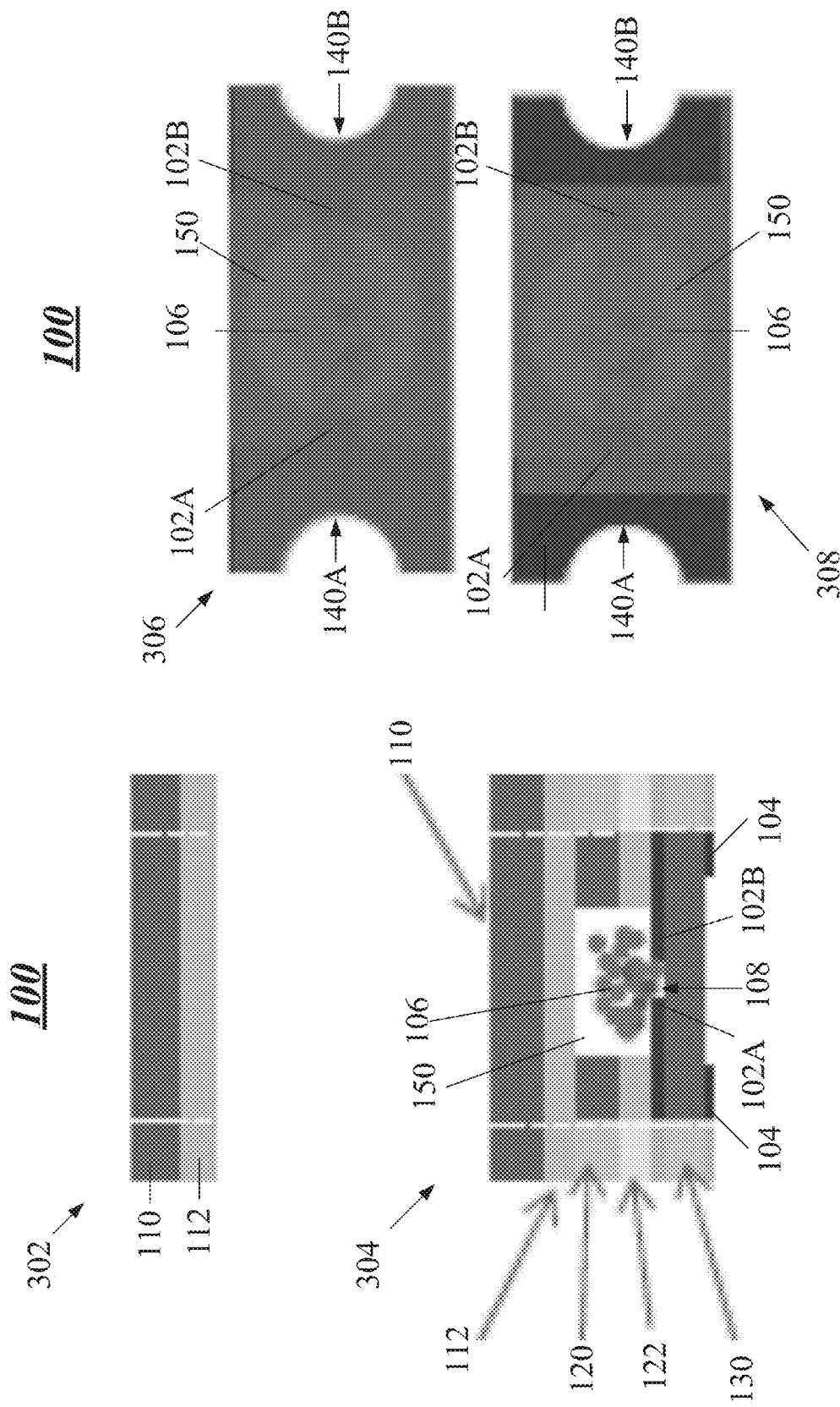

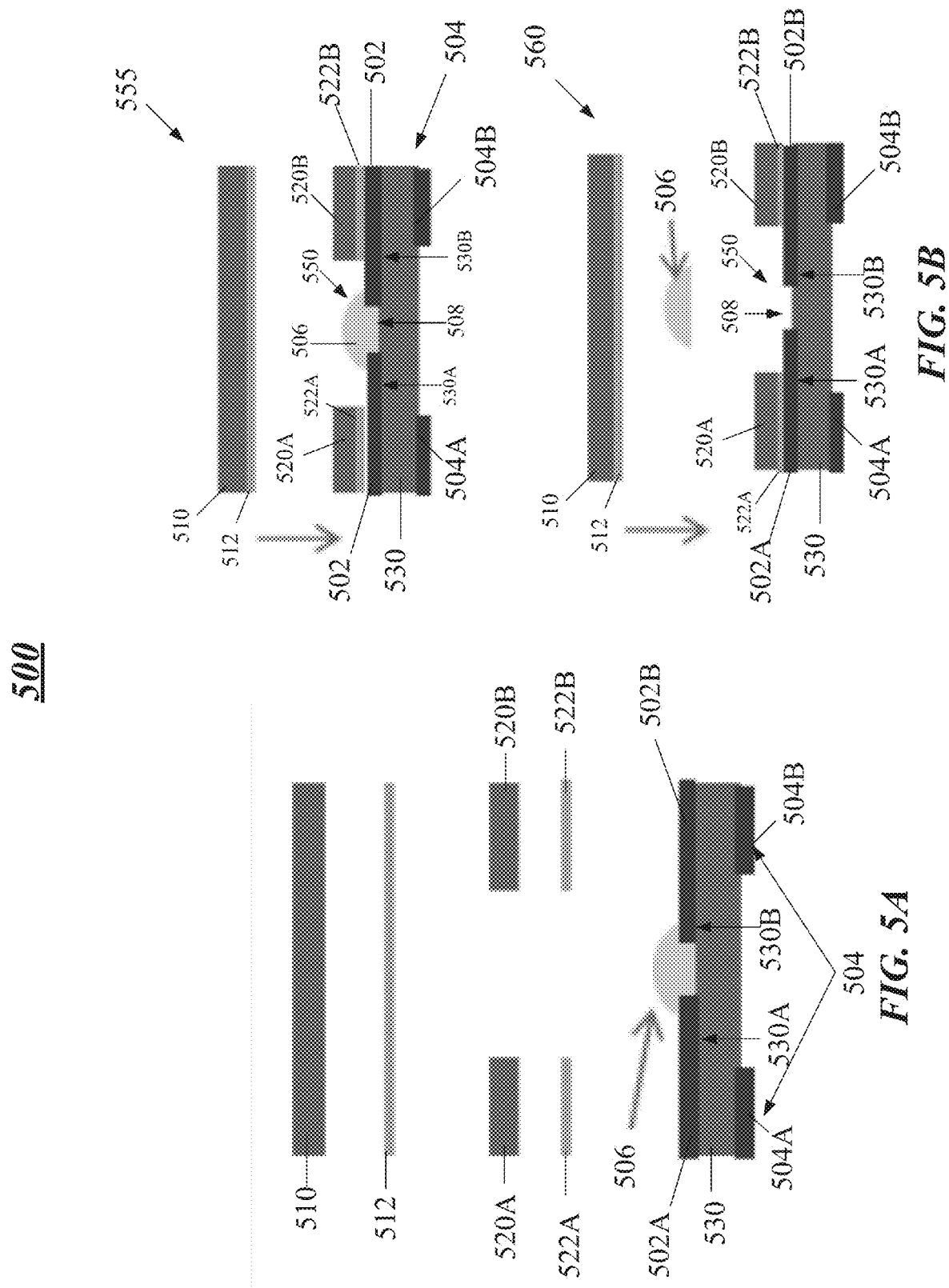

SURFACE-MOUNTABLE ELECTRICAL CIRCUIT PROTECTION DEVICE

CROSS-REFERENCE TO RELATED APPLICATION

This application claims priority to U.S. Provisional Patent Application No. 62/106,384, filed Jan. 22, 2015, entitled "SURFACE-MOUNTABLE ELECTRICAL CIRCUIT PROTECTION DEVICE," which is incorporated by reference herein in its entirety.

FIELD OF THE DISCLOSURE

The disclosure relates generally to the field of circuit protection devices for protection against electrostatic discharge (ESD) and, more particularly, to a surface-mountable electrical circuit device.

BACKGROUND OF THE DISCLOSURE

Electric circuits and components are subject to electrical overstress (EOS), which is a phenomenon where electrical signals applied to a circuit or a device exceed normal operating parameters. These excessive electrical signals are abnormal by definition and are not a part of normal operation (e.g., no excessive electrical signals) of the devices. EOS transients produce high electric fields and usually high peak powers capable of destroying circuits or the highly sensitive electrical components in the circuits, rendering the circuits and the components non-functional, either temporarily or permanently. The EOS transient can include transient voltage or current conditions capable of interrupting circuit operation or destroying the circuit outright. Particularly, EOS transients may arise, for example, from an electromagnetic pulse, an electrostatic discharge, lightning, or be induced by the operation of other electronic or electrical components. Such transients may rise to their maximum amplitudes in microsecond to sub-nanosecond time frames and may be repetitive in nature.

Electronic circuits and components are particularly prone to damage when subjected to electrostatic discharges, commonly known as ESD. The voltage of an electrostatic charge can range from several hundred volts to several thousand volts. When an integrated circuit is subjected to an electrostatic discharge, the voltage and duration is often sufficient to damage semiconductor junctions, thereby rendering circuits unable to function. Capacitors and other components can also be damaged by the voltage of an electrostatic discharge. The current of an electrostatic discharge generally finds a path through the damaged component to a circuit ground or other reference voltage or line.

As such, there is an increased demand for materials and electrical components, which can protect electronic circuits from ESD.

SUMMARY

Thus, a need exists for a surface-mountable electrical circuit device for protection against electrostatic discharge (ESD). It is with respect to these and other considerations that the present improvements have been needed.

Various embodiments are generally directed to a surface-mountable electrical circuit protection device having a first support substrate; a first electrode and a second electrode formed on the first support substrate, the first electrode and the second electrode formed from a conductive material; a first bonding pad disposed on the first and second electrode, the first bonding pad having a first cavity formed therein; a second support substrate disposed on the first bonding pad, the second support substrate having a second cavity formed therein; a voltage variable material disposed within the first cavity and the second cavity and electrically connected to the first electrode and the second electrode; a second bonding pad disposed on the second support substrate; and a third support substrate disposed on the second bonding pad. Other embodiments of the electrical circuit protection device are described and claimed herein.

Various embodiments are generally directed to an electrical circuit protection device including a first support substrate; a first electrode and a second electrode formed on the first support substrate, the first electrode and the second electrode formed from a conductive material; a second support substrate having a cavity defined therein and disposed on the first substrate, and a voltage variable material disposed on the first substrate and within the cavity of the second support substrate and electrically connected to the first electrode and the second electrode.

A method for forming an electrical circuit protection device in accordance with the present disclosure may providing a first support substrate; providing a first electrode and a second electrode formed on the first support substrate, the first electrode and the second electrode formed from a conductive material; providing a first bonding pad disposed on the first and second electrode, the first bonding pad having a first cavity formed therein; providing a second support substrate disposed on the first bonding pad, the second support substrate having a second cavity formed therein; providing a voltage variable material disposed within the first cavity and the second cavity and electrically connected to the first electrode and the second electrode; providing a second bonding pad disposed on the second support substrate; and providing a third support substrate disposed on the second bonding pad.

BRIEF DESCRIPTION OF THE DRAWINGS

By way of example, specific embodiments of the disclosed device will now be described, with reference to the accompanying drawings, in which:

FIG. 3A illustrates a cross-sectional side view depicting final assembly of the electrical circuit protection device depicted in FIGS. 2A-2B;

FIG. 3B illustrates top and bottom views of the electrical circuit protection device depicted in FIG. 3A;

FIG. 5A illustrates an exploded cross-sectional view of an electrical circuit protection device in accordance with the present disclosure;

FIG. 5B illustrates a cross-sectional view depicting various stages of assembly of the electrical device depicted in FIG. 5A;

DETAILED DESCRIPTION

Figures 1A, 1B:
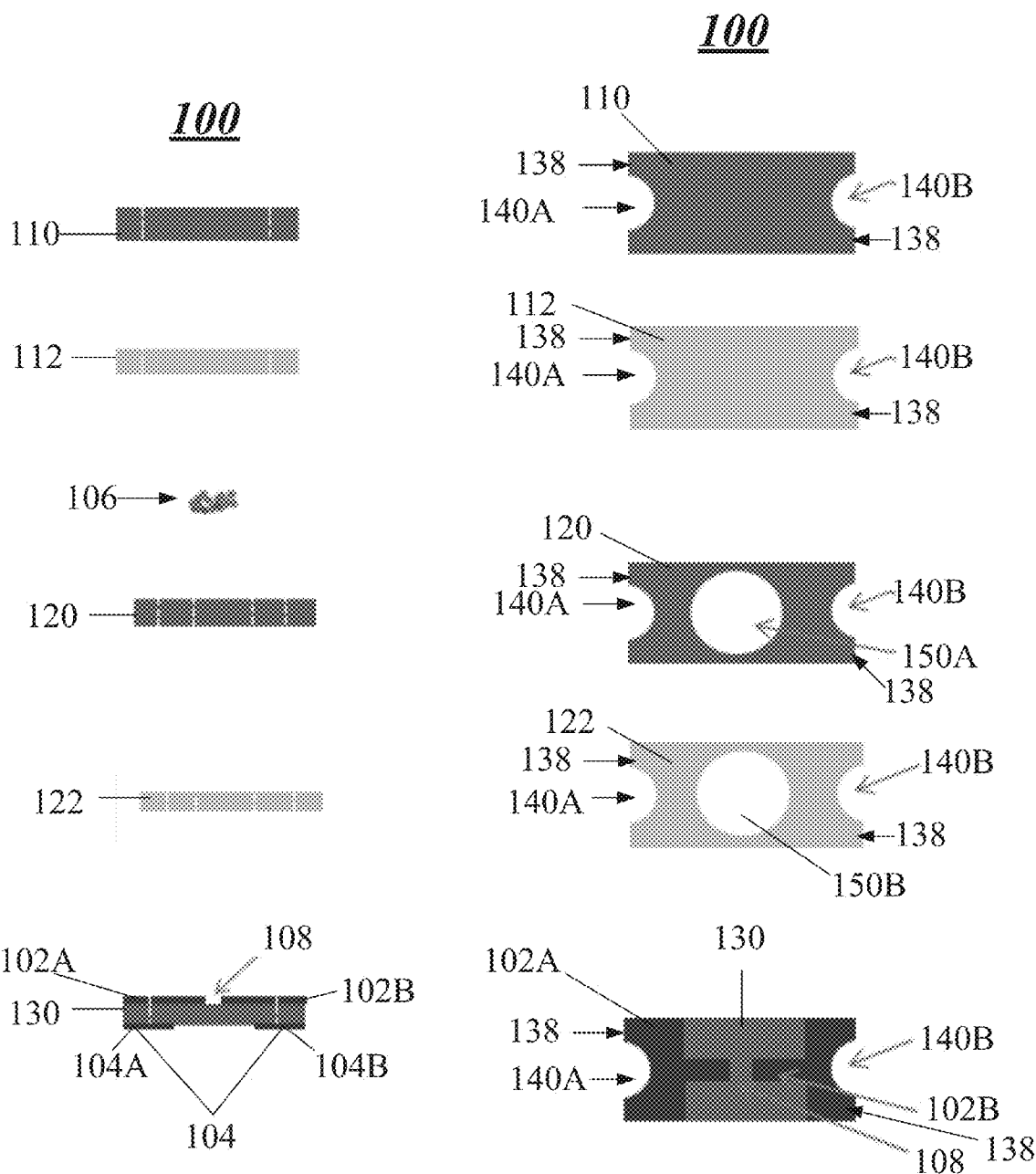
FIG. 1A illustrates an exploded side view of an electrical circuit protection device in accordance with the present disclosure.
FIG. 1B illustrates corresponding top views of components of the electrical circuit protection device depicted in FIG. 1A.

The present disclosure will now be described more fully hereinafter with reference to the accompanying drawings, in which preferred embodiments are shown. This disclosure, however, may be embodied in many different forms and should not be construed as limited to the embodiments set forth herein. Rather, these embodiments are provided so that this disclosure will be thorough and complete, and will fully convey the scope of the disclosure to those skilled in the art. In the drawings, like numbers refer to like elements throughout.

As described herein, an electrical circuit protection device is provided for the protection against EOS transients and is designed to respond substantially instantaneously (i.e., ideally before a transient wave reaches its peak) to shunt EOS transients away from sensitive circuitry for the duration of the EOS transient. The electrical circuit protection device is characterized by high electrical resistance values at low or normal operating voltages and currents. In response to an EOS transient, the electrical circuit protection device switches substantially instantaneously to provide a low electrical resistance value. EOS materials of the electrical circuit protection device can have a non-linear resistance as a function of voltage. When the EOS threat has been mitigated, EOS materials of the electrical circuit protection device can return to their high resistance value. The EOS materials of the electrical circuit protection device are capable of repeated switching between the high and low resistance states, allowing circuit protection against multiple EOS events. The EOS materials of the electrical circuit protection device are also capable of recovering substantially instantaneously to their original high resistance value upon termination of the EOS transient. For purposes of the present disclosure, EOS materials which can exhibit a non-linear resistance or a variable resistance as a function of voltage will be referred to as "voltage variable" materials. The voltage variable material may comprise a polymeric binder with conductive, semi-conductive, and insulative particles dispersed therein.

FIG. 1A illustrates an exploded side view of an electrical circuit protection device 100 in accordance with the present disclosure. FIG. 1B illustrates corresponding top views of the components of the electrical circuit protection device 100 depicted in FIG. 1A. In one embodiment, the electrical circuit protection device 100 may be a surface-mountable electrical circuit protection device having a first support substrate 130. A first electrode 102A and a second electrode 102B may be formed and/or disposed on the first support substrate 130. The first electrode 102A and the second electrode 102B can be separated by an electrode gap 108. The first electrode 102A and the second electrode 102B are formed from a conductive material, such as, for example, silver, nickel, aluminum, platinum, gold, zinc and alloys thereof. A first bonding pad 122 may be disposed on the first electrode 102A and the second electrode 102B. The first bonding pad 122 may include a first cavity 150B (e.g., a cavity hole or aperture) formed therein. A second support substrate 120 may be disposed on the first bonding pad 122. The second support substrate 120 may include a second cavity 150A (e.g., a cavity hole or aperture) formed therein. The first cavity 150B and the second cavity 150A can have material removed to form a well or cavity and/or an open aperture. The first cavity 150B and the second cavity 150A combined may form voltage variable material protection cavity 150 (see FIGS. 2A-2B), which may include the first cavity 150b and the second cavity 150A. The diameters of the first cavity 150B and the second cavity 150A can be of substantially the same size.

Figures 2A, 2B:
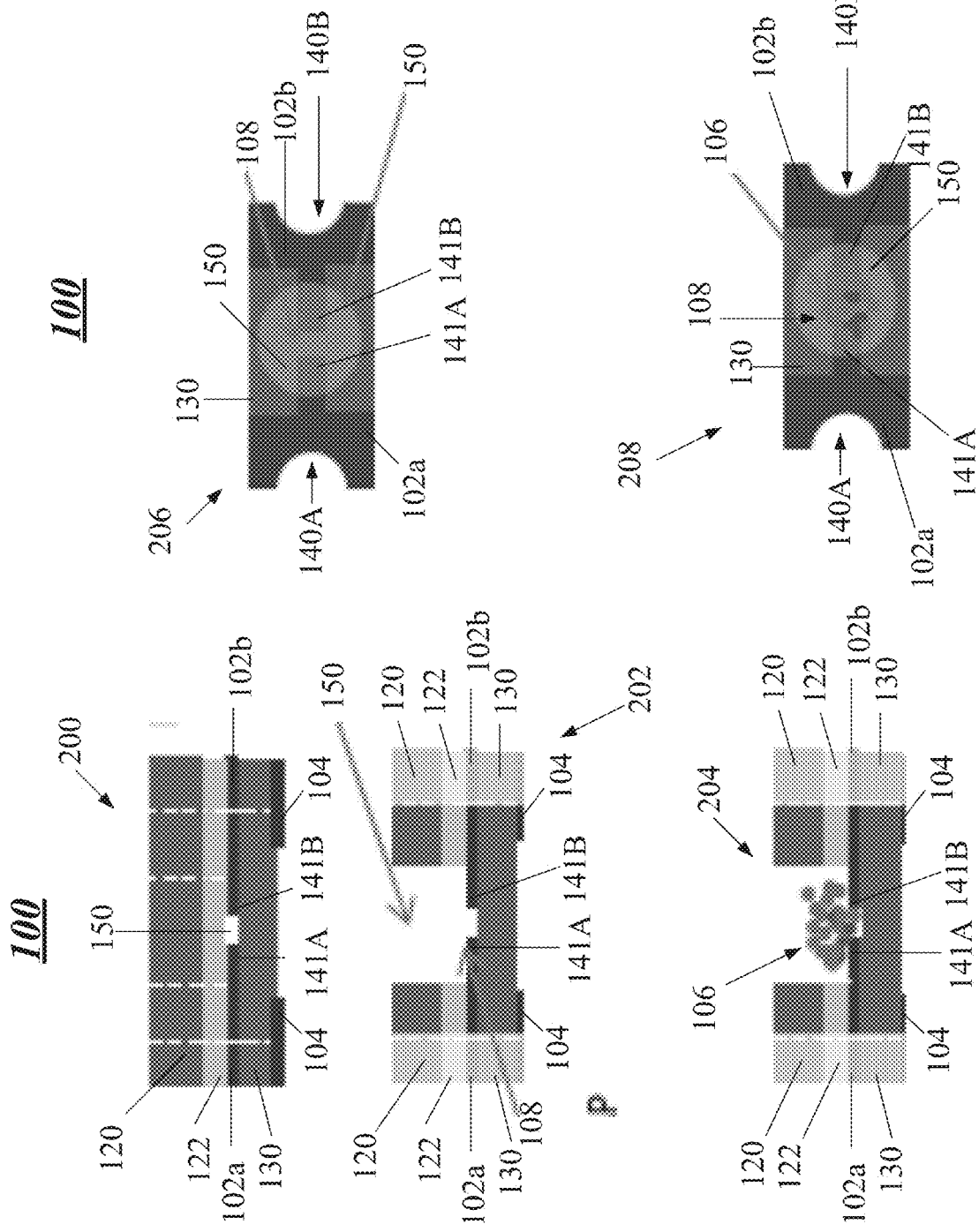
FIG. 2A illustrates a cross-sectional side view depicting various stages of assembly of the electrical circuit protection device of FIGS. 1A-1B.
FIG. 2B illustrates top-to-down views of the electrical protection device depicted in FIG. 2A.

As the first electrode 102A and the second electrode 102B are formed and/or disposed on the first support substrate 130, the first electrode 102A and the second electrode 102B are separated from each other and confront each other in an "edge-to-edge" manner so as to form the electrode gap 108 (see also FIG. 2B). In other words, the first electrode 102A and the second electrode 102B become two edge-to-edge confronting electrodes. In one embodiment, the first electrode 102A and the second electrode 102B may be co-planar.

A voltage variable material 106 may be disposed within the first cavity 150B and the second cavity 150A and electrically connected to the first electrode 102A and the second electrode 102B. A second bonding pad 112 may be disposed on the second support substrate 120. In one embodiment, the first bonding pad 122 and the second bonding pad 112 may be electrically insulating substrates and/or an epoxy layer. A third support substrate 110 may be disposed on the second bonding pad 112. In one embodiment, the first support substrate 130, the second support substrate 120, and the third support substrate 110 include castellations 138 on opposite edges 140A, 140B (i.e., the outer most edges as compared to the inside area housing the voltage variable material 106) of each of the first support substrate 130, the second support substrate 120, and the third support substrate 110.

It should be noted that the size of the voltage variable material protection cavity 150 may be of a variety of predetermined sizes (e.g., depth and/or diameter). For example, in one embodiment, voltage variable material protection cavity 150 may be approximately 0.020" inches in diameter. In one embodiment, the voltage variable material protection cavity 150 may be approximately 0.025" inches in diameter or larger. As the size of the voltage variable material protection cavity 150 increases, the greater an air gap that is formed surrounding the voltage variable material 106 (or an air gap may completely surround the voltage variable material 106 as illustrated more clearly in voltage variable material protection cavity hole 450 in FIG. 4). As such, as the diameter of the voltage variable material protection cavity 150 increases, the risk for insulation resistance (IR) failure is reduced, as compared to a smaller diameter voltage variable material protection cavity 150, which increases the risk for IR failure. Also, a larger diameter of the voltage variable material protection cavity 150 allows more room for alignment of the voltage variable material 106 while still controlling the voltage variable material 106 deposit through a stencil aperture size.

In some embodiments, the voltage variable material (VVM) 106 can substantially fill the gap between the first and second electrodes 102A-B. A portion of the cavity can be filled with the VVM 106. Alternatively, a portion of the variable material protection cavity 150 can be left unfilled with VVM 106 such that the VVM 106 does not entirely fill or cover the variable material protection cavity 150 formed over the electrode gap 108 and the first and second electrodes 102A-B. One or more additional layers or substrates can be positioned over the one or more layers positioned over the first and second electrodes 102A-B that form the variable material protection cavity 150. The one or more additional layers or substrates can comprise bonding or adhesive layers. The one or more additional layers or substrates can form a cover of the electrical circuit protection device 100. That is, the one or more additional layers or substrates can seal the variable material protection cavity 150 containing the VVM 106. The one or more additional layers or substrates can seal the cavity such that a gap or space is provided between the one or more additional layers and the VVM 106 deposited in the variable material protection cavity 150 since the VVM 106 can be deposited such that it does not fill the variable material protection cavity 150.

The one or more additional layers or substrates can form a rigid cover for the electrical circuit protection device 100. The rigid cover of the circuit protection device can protect the integrity of the variable material protection cavity 150 containing the VVM 106 and including a gap separating the VVM 106 from the one or more additional layers. By maintaining a gap in the variable material protection cavity 150 such that the VVM 106 does not fill the entirety of the variable material protection cavity 150, performance of the electrical circuit protection device 100 can be improved. Specifically, the insulation resistance of the circuit protection device can be improved across multiple voltage pulses.

In certain embodiments, the variable material protection cavity 150 can have a diameter of 0.020 inches or larger (e.g., 0.025 inches). In certain embodiments, the VVM 106 can be deposited over the gap of the electrodes 102A-B and in the variable material protection cavity 150 as a thin layer (e.g., as a thin stencil layer having a thickness of 0.006 inches or lower, such as a thickness of 0.002 inches). In certain embodiments, the VVM 106 is positioned in the electrode gap 108 between the electrodes 102A-B and in the variable material protection cavity 150 and is not positioned underneath the electrodes 102A-B. In certain embodiments, the VVM 106 does not fill the variable material protection cavity 150 and instead a gap or space is provided between the VVM 106 and the walls of the variable material protection cavity 150 (formed by the one or more layers positioned over the first and second electrodes 102A-B) and the rigid cover of the variable material protection cavity 150 (formed by the one or more additional layers or substrates positioned over the cavity).

Furthermore, in some embodiments, the first bonding pad 122 and the second bonding pad 112 may include the castellations 138 on opposite edges 140A, 140B of the first bonding pad 122 and the second bonding pad 112. In one embodiment, the castellations 138 on opposite edges 140A, 140B of the first support substrate 130, the second support substrate 120, the third support substrate 110, the first bonding pad 122 and the second bonding pad 112 may be created via a drilling process. The castellations 138 may be substantially the same for each layer of the electrical circuit protection device 100 so the cut outs are aligned across each of the layers as they are stacked upon each other layer.

The opposite edges 140A, 140B may be at the longitudinal ends of the first support substrate 130, the second support substrate 120, the third support substrate 110, the first bonding pad 122 and the second bonding pad 112. The castellations 138 on opposite edges 140A, 140B may be formed by drilling. The longitudinal ends, such as opposite edges 140A, 140B of the first support substrate 130, the second support substrate 120, the third support substrate 110, the first bonding pad 122 and the second bonding pad 112 may plated with copper or other electrically conductive materials (or metals), such as by a photolithography process or other plating means, to facilitate electrical connection of the first electrode 102A and the second electrode 102B of the assembled the electrical circuit protection device 100. The first electrode 102A and the second electrode 102B of the assembled electrical circuit protection device 100 may be connected to outer terminations 104 (shown individually as 104A and 104B in FIG. 1A), which can partially wrap around opposite ends of the electrical circuit protection device 100.

The outer terminations 104A and 104B can be in physical and electrical contact with the first electrode 102A and the second electrode 102B. In one embodiment, the outer terminations 104A may be in physical and electrical contact with the first electrode 102A and another one of the outer terminations 104B may be in separate physical and electrical contact with the second electrode 102B. In an alternative embodiment, the outer terminations 104A and 104B may be one singular termination coupled to both the first electrode 102A and the second electrode 102B.

In some embodiments, the electrical circuit protection device 100 may be mounted to a printed circuit (PC) board by either side since the outer terminations 104A and 104B can wrap around a portion of the electrical circuit protection device 100 making the electrical circuit protection device 100 symmetrical. This is advantageous for smaller devices where orientation on a PC board is often difficult.

Moreover, the electrical circuit protection device 100 depicted in FIGS. 1A-1B provides a benefit of a more robust design by having a third support substrate 110, such as a rigid cover. The third support substrate 110 may be prevented from contacting or compressing the voltage variable material 106 when disposed or positioned over/above the voltage variable material 106 during a bonding and/or or pressing operation that can occur during assembly and/or operation of the electrical circuit protection device 100. By preventing the third support substrate 110 from contacting and/or compressing the voltage variable material 106, there can be reduced IR failure or IR shifting exhibited by the electrical circuit protection device 100. An additional benefit is the improvement of IR over repeated exposure to pulses, such as, for example, from an electromagnetic pulse, an electrostatic discharge, induced by the operation of other electronic or electrical components.

FIG. 2A illustrates a cross-sectional side view depicting stages of assembly of the electrical circuit protection device 100. FIG. 2B illustrates corresponding perspective top-to-down views of the electrical circuit protection device 100 depicted in FIG. 2A. More specifically, FIGS. 2A-2B illustrate various views 200, 202, 204, 206, and 208 of the electrical circuit protection device 100. As illustrated herein, FIGS. 2A-2B depict various stages of assembly of the electrical circuit protection device 100. View 200 is a partially assembled electrical circuit protection device 100 without the variable material protection cavity 150. View 206 can correspond to a top view of side view 200. View 202 can show formation of the voltage variable material protection cavity 150. View 204 can show the position of the voltage variable material 106 within the voltage variable material protection cavity 150. View 208 can correspond to a top view of side view 204.

View 200 illustrates a stage of assembly depicting the second support substrate 120 and the first bonding pad 122 layered onto the first electrode 102A and the second electrode 102B which are formed and/or disposed on the first support substrate 130. In one embodiment, after the first electrode 102A and the second electrode 102B may be bonded and/or formed on the first support substrate 130, a bonding or pressing operation may be performed to bond the first electrode 102A and the second electrode 102B to the second support substrate 120 having the first bonding pad 122. When the first electrode 102A and the second electrode 102B are formed and/or disposed on the first support substrate 130, the first electrode 102A and the second electrode 102B may be separated from each other and confront each other in an "edge-to-edge" manner so as to form the electrode gap 108. In other words, the first electrode 102A and the second electrode 102B can become two edge-to-edge confronting electrodes.

The electrode gap 108, as illustrated in FIGS. 1A-1B and FIGS. 2A-2B, may also form a bottom portion of the variable material protection cavity 150. The electrode gap 108 may be created between the first electrode 102A and the second electrode 102B. In one embodiment, the electrode gap 108 is formed via a photo lithographic/electrolytic deposition process. The first electrode 102A and the second electrode 102B may be coplanar, wherein the electrode gap 108 creates a well or cavity. In some embodiments, the electrode gap 108 may have a geometric configuration and dimension so that at least a portion of the voltage variable material 106 may be placed in the electrode gap 108.

The electrode gap 108 may be formed between the two edge-to-edge confronting electrodes, such as first electrode 102A and the second electrode 102B, which are separately disposed on a supporting substrate, such as the first support substrate 130. The inner end edges 141A, 141B of the first electrode 102A and the second electrode 102B form the active electrode area. The first electrode 102A and the second electrode 102B may occupy a relatively large planar area with the active areas of the first electrode 102A and the second electrode 102B as the portion of the electrode in contact with the voltage variable material 106. Moreover, in order to obtain the proper shunting of voltages for certain applications, the electrode gap 108 between the inner end edges 141A, 141B of the first electrode 102A and the second electrode 102B may be predetermined, defined according to manufacturing specifications, and/or substantial two (2) mils or three (3) mils (a mil being a thousandth of an inch). The first electrode 102A and the second electrode 102B are applied to one of the surfaces of the first support substrate 130 using a conventional photo lithographic/electrolytic deposition process. In order to ensure a good connection between the first electrode 102A and the second electrode 102B and the first support substrate 130, the first support substrate 130 is first cleaned. Moreover, prior to an operation of assembly for the electrical circuit protection device 100, the first support substrate 130, the second support substrate 120, and the third support substrate 110 may first be cleaned.

Preferred materials for use as the first support substrate 130 include FR-4 epoxy, polyimide and ceramic. FR-4 epoxy cured to C-stage is especially preferred. Also, the first support substrate 130, the second support substrate 120, and the third support substrate 110 may be FR-4 without a copper (Cu) clad on both sides. A photo resist material may be applied to surfaces of the first support substrate 130. A stencil or mask is applied to the photo resist material and the unmasked material is cured or developed. The photo resist material covering the portion of the surface to receive the first electrode 102A and the second electrode 102B (i.e., the uncured material) may be stripped and rinsed away. The first electrode 102A and the second electrode 102B are then applied to an inner, exposed surface of the first support substrate 130. Preferably copper (Cu) may be applied to the surfaces of the first support substrate 130 via electrolytic deposition. It should be understood, however, that a number of conductive materials (e.g., metals) may be used to form the first electrode 102A and the second electrode 102B, e.g., silver, nickel, aluminum, platinum, gold, zinc and alloys thereof. After the first electrode 102A and the second electrode 102B are applied to the first support substrate 130, the remaining cured photo resist material may be removed by exposing the material to a chemical bath.

Views 202 and 206 illustrate a next stage of assembly depicting formation of the variable material protection cavity 150. The stage of assembly depicted in views 202 and 206 can be a stage following a stage of assembly depicted in view 200. The variable material protection cavity 150 can be created by removing portions of the first bonding pad 122 and the second support substrate 120. As an example, the variable material protection cavity 150 can be formed by boring out portions of the second support substrate 120 and the first bonding pad 122 that are layered onto the first electrode 102A and the second electrode 102B. By removing material from the first bonding pad 122 and the second support substrate 120, a cavity or hole (i.e., the variable material protection cavity 150) is formed.

View 204 and corresponding view 208 show a further stage of assembly subsequent to the stage of assembly shown in view 202 and corresponding view 206. As shown in views 204 and 208, at least a portion of the voltage variable material 106 may be deposited in the variable material protection cavity 150 and into the electrode gap 108. The variable material protection cavity 150 prevents the voltage variable material 106, after being deposited into the variable material protection cavity 150 and the electrode gap 108, from being pressed during any bonding, pressing, and/or assembly of the electrical circuit protection device 100. The voltage variable material 106 can be positioned over the first electrode 102A and second electrode 102B.

As an alternative to forming the variable material protection cavity 150 by removing portions of the bonding pad 122 and second support substrate 120 after each is layered on top of the first electrode 102A and second electrode 102B and substrate 130, the voltage material protection cavity can be formed by boring out portions of the second support substrate 120 and the first bonding pad 122 prior to being layered onto the first electrode 102A and the second electrode 102B. Accordingly, depositing of the voltage variable material 106 may occur via a stencil printing and/or may be deposited via the stencil printing prior to and/or at the same time as the second support substrate 120 and the first bonding pad 122 are assembled onto the first electrode 102A and the second electrode 102B.

As described herein, views 200, 202, 204, 206, and 208 are intended to highlight certain details of different stages of assembly of the electrical circuit protection device 100. For example, by filling the electrode gap 108 with the voltage variable material 106 having insulating, conductive, or semiconductive particles of a predetermined size, the characteristics of the voltage variable material 106, taken in conjunction with the spacing of the electrode gap 108, provides EOS protection through a change in resistance. For example, the resistance of the voltage variable material 106 may be a function of the changing voltage levels, such as having a high resistance for lower voltage while having a lower resistance as the voltage is increased. In this way, the voltage variable material 106 may shunt a portion of the excessive voltage or current, thereby protecting the electrical circuit and its components. The major portion of the threat transient can be reflected back towards the source of the threat. A reflected transient wave is attenuated by the source, radiated away, or re-directed back to the surge protection device, which responds with each return pulse until the threat energy is reduced to safe levels.

The electrode gap 108 and the variable material protection cavity 150 allow the voltage variable material 106 to be positioned in such a way that upon bonding and/or pressing the third support substrate 110, having the second bonding pad 112 bonded thereto, any contact, pressure, or compression is eliminated or reduced. In other words, the protection cavity, such as first cavity 150B, prevents the voltage variable material 106 from being pressed during any bonding or pressing assembly operation, and/or any succeeding processes.

FIG. 3A illustrates a cross-sectional side view depicting final assembly of the electrical circuit protection device 100 in accordance with the present disclosure. FIG. 3B illustrates top and bottom views of the fully assembled electrical circuit protection device 100. More specifically, FIGS. 3A-3B illustrate various views 302, 304, 306, and 308 of the electrical circuit protection device 100. View 302 depicts a cross-sectional side view of a third support substrate 110, such as a rigid cover (including a second bonding pad 112) of the electrical circuit protection device 100. View 304 depicts a cross-sectional side view of an assembled electrical circuit protection device 100 having third support substrate 110, such as a rigid cover (including the second bonding pad 112) positioned over the variable material protection cavity 150 and bonded to second support substrate 120. View 306 depicts a top view of the assembled electrical circuit protection device 100 and shows third support substrate 110 and castellations on opposite edges 140A, 140B. View 308 depicts a bottom view of the assembled electrical circuit protection device 100 and shows bottom substrate, such as the first support substrate 130, and castellations 138 on opposite edges 140A, 140B. As described herein, views 302, 304, 306, and 308 are intended to highlight certain details of the final assembled electrical circuit protection device 100.

A bonding and/or pressing operation may be performed to bond the third support substrate 110 to the second bonding pad 112. Bonding material may be used and may be pre-cured into the third support substrate 110. The third support substrate 110 forms a "rigid cover" and is bonded to the second support substrate 120 having the first bonding pad 122. The third support substrate 110, such as a rigid cover, formed by the substrate 110 and second bonding pad 112 cover voltage variable material protection cavity 150 and further prevent the voltage variable material 106 from being pressed during any bonding or pressing assembly operation, and/or any succeeding processes such as use or operation of the electrical circuit protection device 100. In one embodiment, the first cavity 150B and the second cavity 150A (as shown in FIGS. 1A-1B) together form the voltage variable material protection cavity 150 for preventing the voltage variable material 106 from being pressed during any bonding or pressing assembly operation, and/or any succeeding processes or operation.

Figure 4:
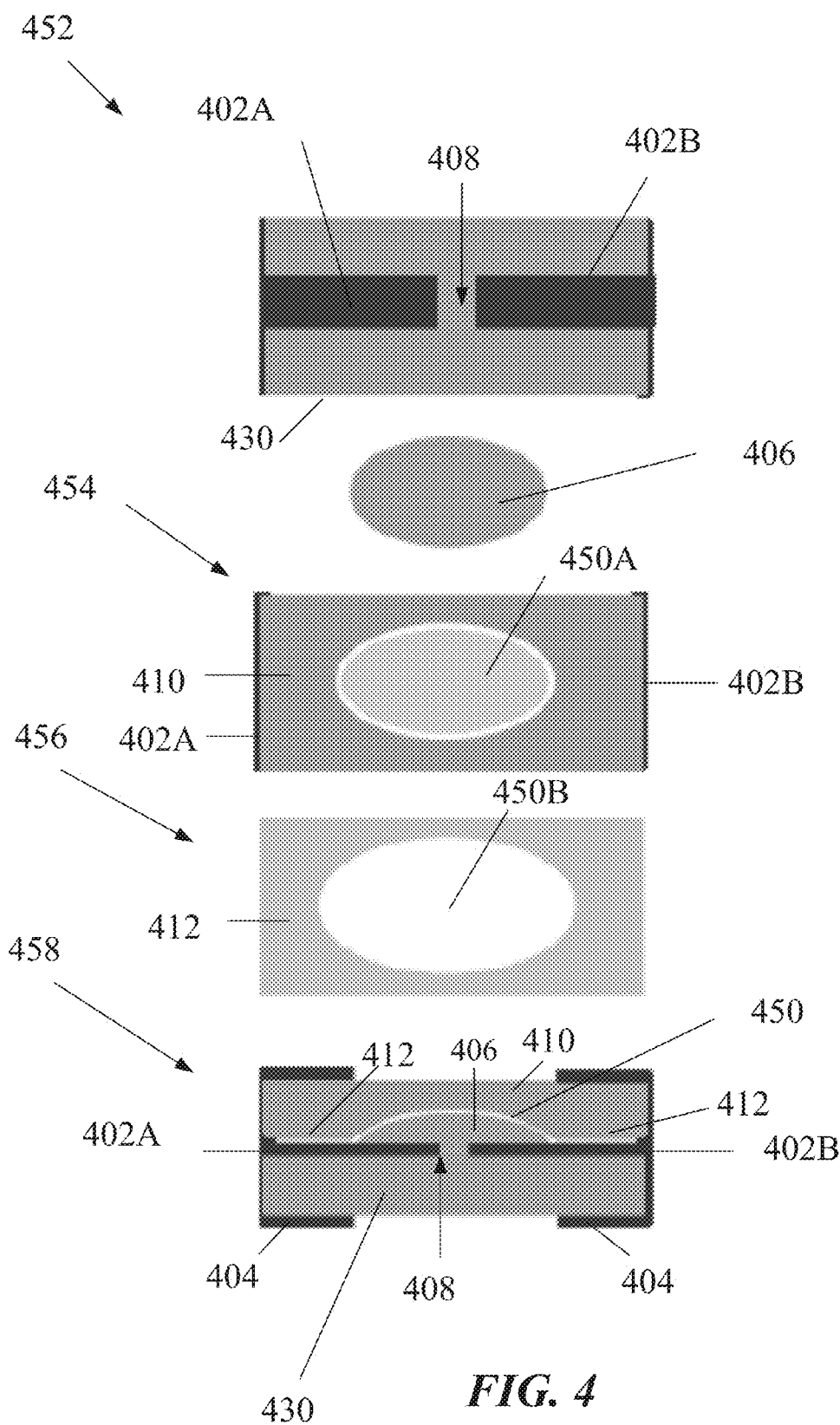
FIG. 4 illustrates an alternative electrical circuit protection device in accordance with the present disclosure.

FIG. 4 illustrates an alternative electrical circuit protection device 400 in accordance with the present disclosure. FIG. 4 shows various views of various portions of the electrical circuit protection device 400. For example, view 452 shows a bottom layer of the electrical circuit protection device 400. View 458 shows a side view of an assembled electrical circuit protection device 400. View 454 shows various materials, layers, or components positioned over the bottom layer of the electrical circuit protection device 400 to form the final assembled electrical circuit protection device 400 depicted in view 458.

As shown in FIG. 4, view 452 shows an assembled bottom portion of the electrical circuit protection device 400 having a support substrate 430, first and second electrodes 402A, 402B, and electrode gap 408.

View 454 shows a support substrate 410 functioning as a rigid cover, a bonding pad 412, and voltage variable material 406. The voltage variable material 406 can be deposited over the first and second electrodes 402A, 402B. The support substrate 410 and the bonding pad 412 can then be positioned over the voltage variable material 406 and the first and second electrodes 402A, 402B as shown in view 458.

The bonding pad 412 and the support substrate 410 can be bonded/pressed onto the support substrate 430.

The first electrode 402A and a second electrode 402B are formed from a conductive material. Electrode gap 408 is created by the first electrode 402A being placed "edge-to-edge" with the second electrode 402B. The electrode gap 408 may be formed via a photo lithographic/electrolytic deposition process.

The bonding pad 412 may be disposed on the first electrode 402A and the second electrode 402B. The electrical circuit protection device 400 may have one bonding pad. The bonding pad 412 may have a first cavity 450B defined therein, and the bonding pad 412 may be disposed and bonded and/or pressed on the support substrate 430. In one embodiment, the first cavity 450B may have material removed to form cavity hole or an open aperture.

The support substrate 410 may have a second cavity 450A defined therein. As shown in view 458, the support substrate 410 may have a substantially flat top portion and a bottom surface having a curved or arched section under which is positioned the voltage variable material 406. The support substrate 410 forms a "rigid cover" and is bonded to the bonding pad 412. The second cavity 450B may have material removed to form the well or cavity and/or an open aperture as shown in view 458.

A voltage variable material 406 may be disposed on the support substrate 430, within the cavity 450B of the bonding pad 412, and electrically connected to the first electrode 402A and a second electrode 402B. The shaping of the bottom surface of the support substrate 410 can reduce or prevent the voltage variable material 406 from being pressed during any bonding or pressing assembly operation, and/or any succeeding processes.

As shown in FIG. 4, the shaping of the bottom surface of the support substrate 410 covering the voltage variable material 406 is substantially conformal with the voltage variable material 406, while still providing a gap between the voltage variable material 406 and the support substrate 410. The first cavity 450B and the second cavity 450A collectively form a voltage variable material protection cavity hole 450, which may be referred to as an "arch cavity", as the voltage variable material protection cavity hole 450 forms an arch or dome shape as the support substrate 410 conforms to the shape of the voltage variable material 406 having an arch or dome shape.

The voltage variable material protection cavity 450 includes an empty space defined between the voltage variable material 406 and the support substrate 410 when the support substrate 410 is disposed on the first substrate. The support substrate 410 can substantially conform to the shape of the deposited voltage variable material 406, resulting in the forming an arch cavity of the voltage variable material protection cavity 450 having a substantially arch or dome shape.

The electrical circuit protection device 400 may include outer terminations 404A and 404B, which wrap around opposite ends of the electrical circuit protection device 400. The outer terminations 404A and 404B can be in physical and electrical contact with the first electrode 402A and the second electrode 402B, respectively. The electrical circuit protection device 400 may be mounted to a PC board by either side since the wrap around outer terminations 404 make the device symmetrical. This is advantageous for smaller devices where orientation on a PC board is often difficult.

Figure 5C:
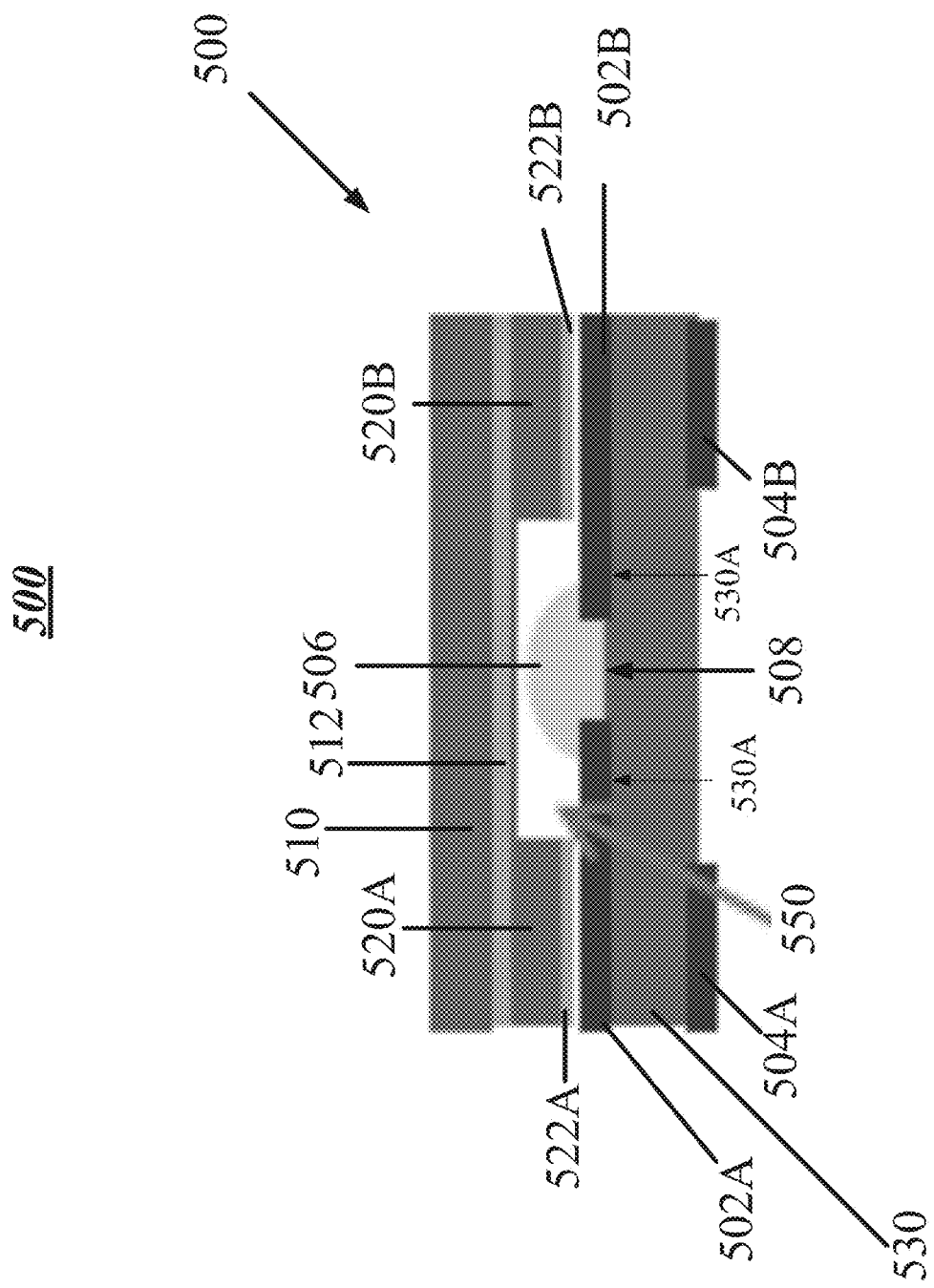
FIG. 5C illustrates a cross-sectional view of final assembly of the electrical device depicted in FIGS. 5A-5B.

FIG. 5A illustrates an exploded cross-sectional side view depicting layered components of an electrical circuit protection device 500 in accordance with the present disclosure. FIG. 5B illustrates assembly of the electrical circuit protection device 500. FIG. 5C illustrates a side view of a fully assembled electrical circuit protection device 500.

View 560 shows the depositing of voltage variable material 506 and view 555 shows the deposited voltage variable material 506 in relation to other components of the electrical circuit protection device 500. As shown in FIGS. 5A and 5B, a rigid cover 510 and bonding pad 512 are bonded and/or pressed together. Further, middle layers 520A-B and 522A-B are bonded onto first electrode 502A and second electrode 502B positioned on a first support substrate 530. The positioning of the middle layers 520A-B and 522A-B can form a cavity 550 (e.g., voltage material protection cavity 550). Middle layer 520A-B can be a substrate. Middle layer 522A-B can be a bonding layer. As further shown in FIGS. 5A and 5B, the rigid third substrate/cover 510 and the bonding pad 512 can be placed and/or disposed on top of the middle layers 520A-B and 522A-B. The voltage variable material 506 can be deposited in the cavity 550. In contrast to the electrical circuit protection device 100, the middle layers 520A-B and 522A-B are formed from two unconnected sections. In other words, the middle layer 520 is formed from two separated portions 520A and 520B, while another the middle layer 522 is formed from two separated bonding pads 522A and 522B.

The first electrode 502A and the second electrode 502B may be applied to the first support substrate 530 using a photolithographic or electrolytic deposition process. In order ensure a good connection between the first and second electrodes 502A and 502B and the first support substrate 530, the first support substrate 530 is first cleaned. Moreover, prior to an operation of assembly for the electrical circuit protection device 500, the first support substrate 530, the second support substrate 520, and the third substrate 510 may first be cleaned.

Preferred materials for use as the first support substrate 530 include FR-4 epoxy, polyimide and ceramic. FR-4 epoxy cured to C-stage is especially preferred. Also, the first support substrate 530, the second support substrate 520, and the third substrate 510 may be FR-4 without a copper (Cu) clad on both sides. A photo resist material may be applied to surfaces of the first support substrate 530. A stencil or mask is applied to the photo resist material and the unmasked material is cured or developed. The photo resist material covering the portion of the surface to receive the first electrode 502A and the second electrode 502B (i.e., the uncured material) is stripped and rinsed away.

The first electrode 502A and the second electrode 502B are then applied to an inner, exposed surface of the first support substrate 530. Preferably copper (Cu) is applied to the surfaces of the first support substrate 530 via electrolytic deposition. It should be understood, however, that a number of conductive materials can be used to form the first electrode 502A and the second electrode 502B, e.g., silver, nickel, aluminum, platinum, gold, zinc and alloys thereof. After the first electrode 502A and the second electrode 502B are applied to the first support substrate 530, the remaining cured photo resist material is removed by exposing the material to a chemical bath. The first electrode 502A and the second electrode 502B is bonded and/or formed on the first support substrate 530.

An electrode gap 508 may be created between the first electrode 502A and the second electrode 502B. In one embodiment, the electrode gap 508 is formed via a photo lithographic/electrolytic deposition process. The first electrode 502A and the second electrode 502B may be coplanar and the electrode gap 508 creates a well or cavity. The electrode gap 508 (e.g., the well or cavity between the first electrode 502A and the second electrode 502B) should have a geometric configuration and dimension so that at least a portion of the voltage variable material 506 may be placed in the gap 508. In one embodiment, the electrode gap 508 is created as the first electrode 502A and the second electrode 502B are applied to the first support substrate 530.

The voltage variable material 506 may be deposited into the voltage material protection cavity 550 formed between the middle layers 520A-B and 522A-B and below top substrate/layers 510 and 512. A portion of the voltage variable material 506 may be received and disposed into the electrode gap 508. The voltage variable material 506 electrically connects first electrode 502A and the second electrode 502B when disposed into the electrode gap 508. The depositing may occur via stencil printing. The two separated portions 520A and 520B may be symmetrically aligned and bonded onto the two second bonding pads 522A and 522B.

The voltage variable material 506 may deposited into the electrode gap 508 and the voltage material protection cavity 550 before, during, and/or after the two separated portions 520A and 520B are symmetrically aligned and bonded onto the two second bonding pads 522A and 522B, and/or before, during, and/or after the two separated portions 520A and 520B and the two second bonding pads 522A and 522B are bonded or pressed onto the outer most sections of the first electrode 502A and the second electrode 502B and the first support substrate 530.

The voltage material protection cavity 550 allows the voltage variable material 506 to be positioned in such a way that upon bonding and/or pressing the third support substrate 510 (having the second bonding pad 512 bonded thereto), any contact, pressure, or compression is eliminated or reduced. In other words, the voltage material protection cavity 550 prevents the voltage variable material 506 from being pressed or compressed during any bonding and/or pressing assembly operation, and/or any succeeding processes.

The electrical circuit protection device 500 may include outer terminations 504A and 504B, which wrap around opposite ends of the electrical circuit protection device 500. The outer terminations 504A and 504B are in physical and electrical contact with the first electrode 502A and the second electrode 502B, respectively. The electrical circuit protection device 500 may be mounted to a PC board by either side since the wrap around outer terminations 504A and 504B make the device symmetrical. This is advantageous for smaller devices where orientation on a PC board is often difficult.

Figure 6:
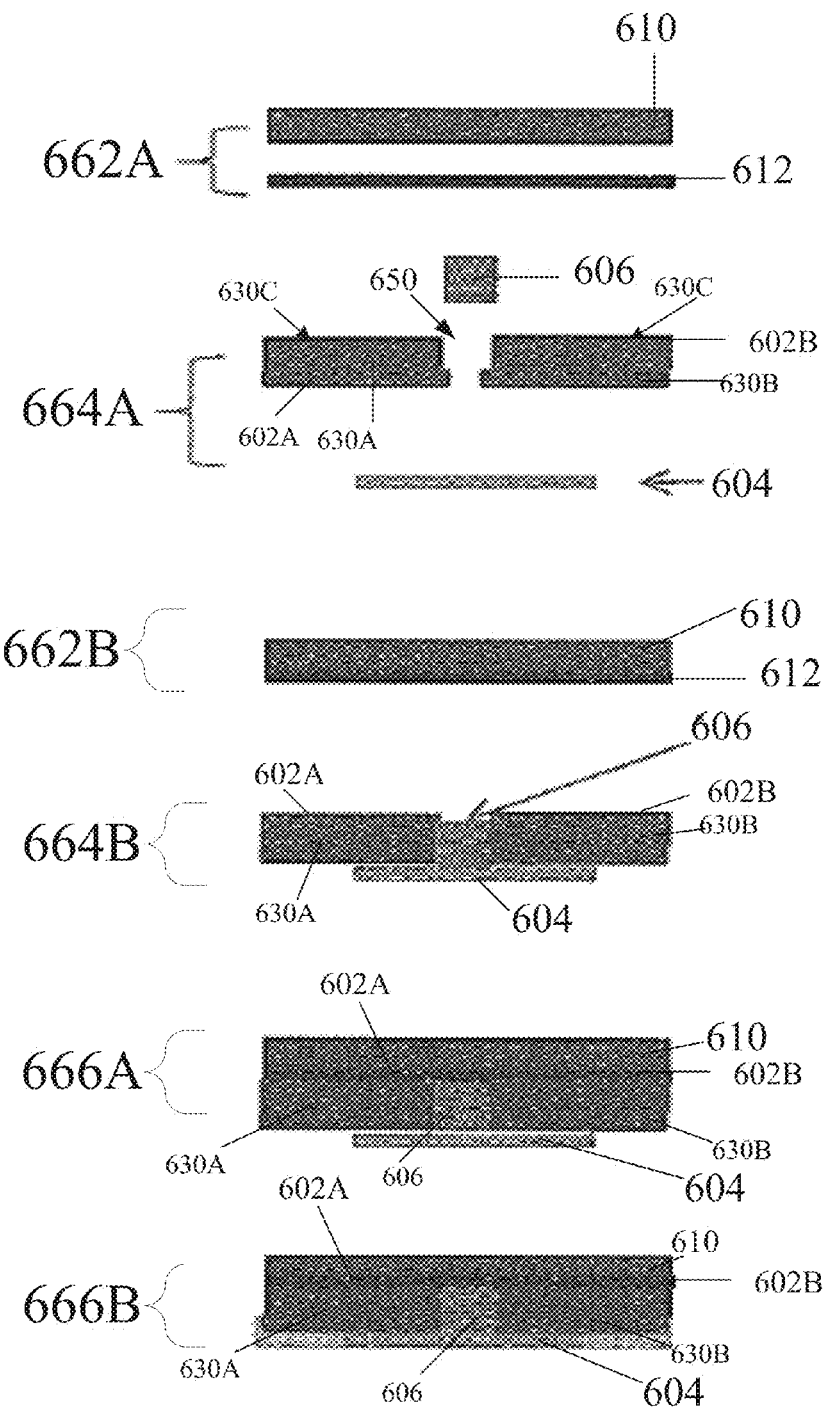
FIG. 6 illustrates a cross-sectional view of an alternative electrical device in FIG. 1 in accordance with the present disclosure.

FIG. 6 illustrates a cross-sectional view of assembly of a further alternative electrical circuit protection device 600 in accordance with the present disclosure. Processes 662A-B, 664A-B, and 666A-B illustrate the assembly of various components of the electrical circuit protection device 600. Each of the processes provided herein may be performed pursuant to desired preferences and/or manufacturer preferences.

At process 662A-B, a third support substrate 610 may be disposed on a second bonding pad 612. The third support substrate 610 and the second ponding pad 612 may form a rigid cover.

At process 664A-B, a first electrode 602A and the second electrode 602B are applied to one of the surfaces of two first substrates 630A and 630B using a conventional photo lithographic/electrolytic deposition process. The first electrode 602A and the second electrode 602B are symmetrically aligned and disposed on the two first substrates 630A and 630B. In order ensure a good connection between the first electrode 602A and the second electrode 602B and the two first substrates 630A and 630B, the two first substrates 630A and 630B are first cleaned. Moreover, prior to an operation of assembly for the electrical device 600, the two first substrates 630A and 630B, the second support substrate 620, and the third support substrate 610 may first be cleaned.

The two first substrates 630A and 630B include an outer termination 604 secured, bonded, and/or pressed onto a bottom portion, such as the third support substrate 610, of the two first substrates 630A and 630B. The an outer termination 604 may be a equal to the width, depth, dimensions, and geometric configuration of the two first substrates 630A and 630B and/or have a different width, depth, dimensions, and geometric configuration of the two first substrates 630A and 630B. For example, the outer termination 604 is has a flat, planer, rectangular geometric shape. In one embodiment, each of the two first substrates 630A and 630B are positioned on outer edges of the outer termination 604 such that a portion of the each of the two first substrates 630A and 630B extend beyond outer edges or sections of the outer termination 604. The two first substrates 630A and 630B are coplanar with each other, while the outer termination 604 is non-coplanar with the two first substrates 630A and 630B. As such, a voltage material protection cavity 650 is created between the two-second support substrates 620A and 620B after being bonded onto the outer termination 604. Next, at least a portion of the voltage variable material 606 may be deposited in the voltage material protection cavity 650. The depositing may occur via a stencil printing. The voltage variable material 606 electrically connects first electrode 602A and the second electrode 602B. The voltage material protection cavity 650 is in physical and electrical contact with the first electrode 602A and the second electrode 602B and the outer termination.

Preferred materials for use as the first substrates 630A and 630B include FR-4 epoxy, polyimide and ceramic. FR-4 epoxy cured to C-stage is especially preferred. Also, the first substrates 630A and 630B, the second support substrate 620, and the third substrate 610 may be FR-4 without a copper (Cu) clad on both sides. A photo resist material may be applied to surfaces of the first substrates 630A and 630B. A stencil or mask is applied to the photo resist material and the unmasked material is cured or developed. The photo resist material covering the portion of the surface to receive the first electrode 602A and the second electrode 602B (i.e., the uncured material) is stripped and rinsed away. The first electrode 602A and the second electrode 602B are then applied to an inner, exposed surface 630C of the first substrates 630A and 630B. Preferably copper (Cu) is applied to the surfaces of the first substrates 630A and 630B via electrolytic deposition. It should be understood, however, that a number of conductive materials can be used to form the first electrode 602A and the second electrode 602B, e.g., silver, nickel, aluminum, platinum, gold, zinc and alloys thereof. After the first electrode 602A and the second electrode 602B are applied to the first support substrate 630, the remaining cured photo resist material is removed by exposing the material to a chemical bath. The first electrode 602A and the second electrode 602B is bonded and/or formed on the first substrates 630A and 630B.

At process 666A-B, the third support substrate 610 and the second bonding pad 612 are bonded and/or pressed onto the first electrode 602A and the second electrode 602B. At process 606A-B, the voltage variable material is positioned in the voltage material protection cavity 650 that upon bonding and/or pressing the third support substrate 610, having the second bonding pad 612 bonded onto the first electrode 602A and the second electrode 602B, any contact, pressure, or compression is eliminated. In other words, the voltage material protection cavity 650 prevents the voltage variable material 606 from being pressed during any bonding or pressing assembly operation, and/or any succeeding processes.

The electrical circuit protection device 600 may be mounted to a PC board by either side since the wrap around outer terminations 604 make the device symmetrical. This is advantageous for smaller devices where orientation on a PC board is often difficult.

Figure 7:
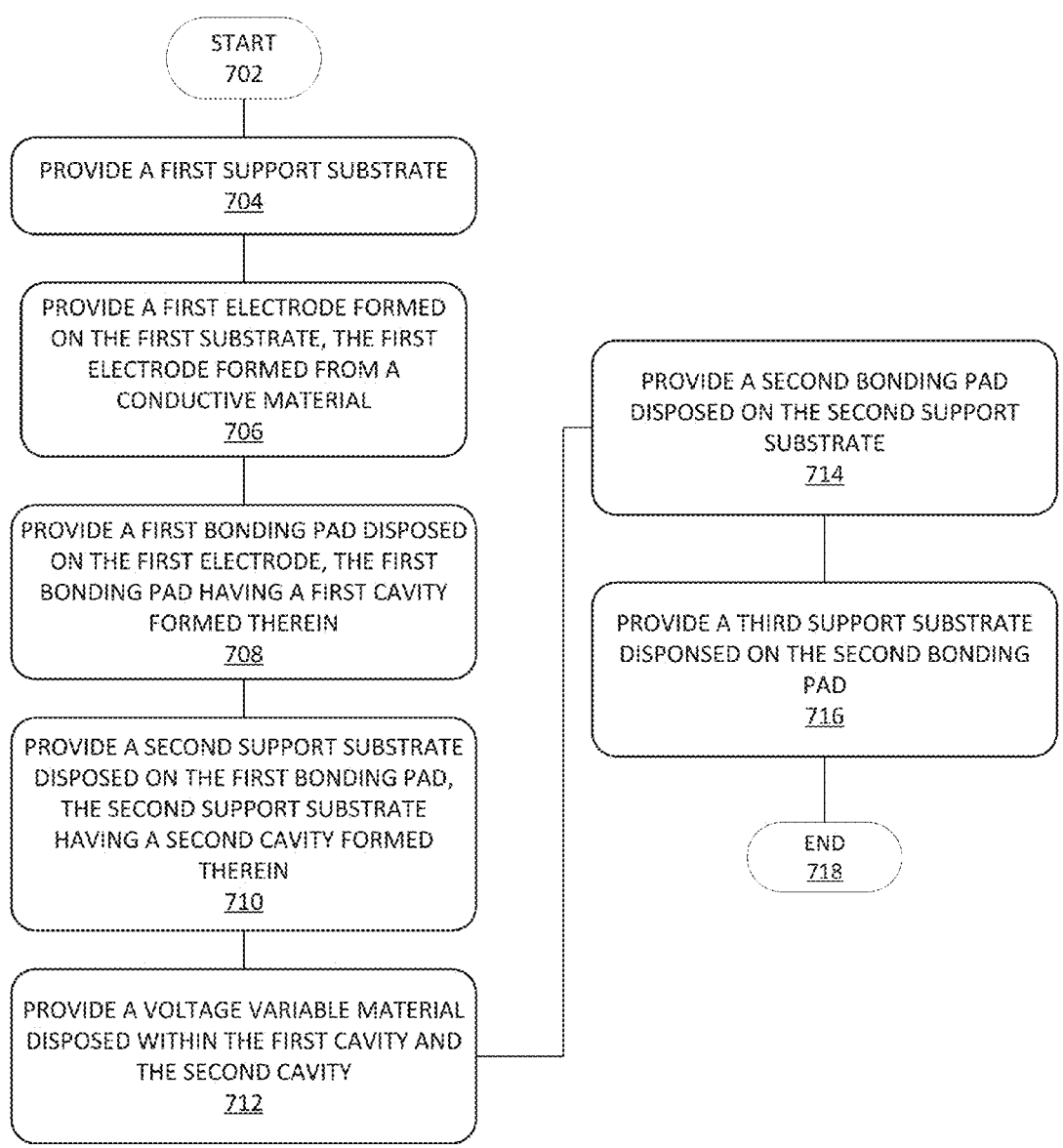
FIG. 7 illustrates a first flow diagram for a method of manufacturing electrical circuit protection devices in accordance with the present disclosure.

FIG. 7 illustrates a flow diagram of an embodiment of the method of manufacturing 700 an electrical circuit protection device in accordance with the present disclosure. The method of manufacturing 700 begins at block 702. For example, by way of illustration, the method of manufacturing of FIG. 7 may be used to manufacture electrical circuit protection device 100, the electrical device 500, and/or the electrical circuit protection device 600. The method of manufacturing 700 moves to block 704. At block 704, a first support substrate is provided. Next, method of manufacturing 700 provides a first electrode and a second electrode formed on the first support substrate, the first electrode and the second electrode formed from a conductive material at block 706. The method of manufacturing 700 provides a first bonding pad disposed on the first and second electrode, the first bonding pad having a first cavity formed therein at block 708. The method of manufacturing 700 provides a second support substrate disposed on the first bonding pad, the second support substrate having a second cavity formed therein at block 710. The first and second cavities can be aligned and can form a single larger cavity. The method of manufacturing 700 provides a voltage variable material disposed within the first cavity and the second cavity and electrically connected to the first electrode and the second electrode at block 712.

The method of manufacturing 700 provides a second bonding pad disposed on the second support substrate at block 714. The method of manufacturing 700 provides a third support substrate disposed on the second bonding pad at block 716. The method of manufacturing 700 may end at block 718.

Figure 8:
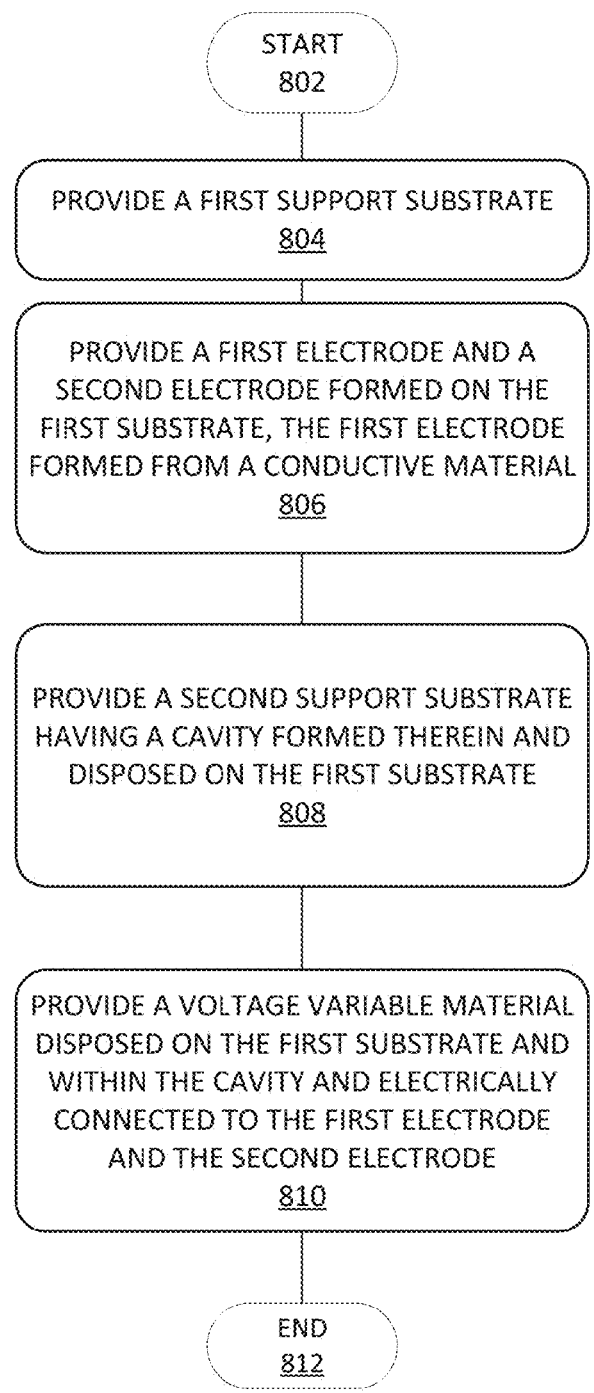
FIG. 8 illustrates a second flow diagram for a method of manufacturing electrical circuit protection devices in accordance with the present disclosure.

FIG. 8 illustrates a flow diagram of an embodiment of the method of manufacturing 800 an electrical circuit protection device in accordance with the present disclosure. For example, by way of illustration, the method of manufacturing of FIG. 8 may be used to manufacture electrical circuit protection device 400 and/or electrical circuit protection device 500. The method of manufacturing 800 begins at block 802. The method of manufacturing 800 moves to block 804. The method of manufacturing 800 provides a first support substrate at block 804. The method of manufacturing 800 provides a first electrode and a second electrode formed on the first support substrate, the first electrode and the second electrode formed from a conductive material at block 806. The method of manufacturing 800 provides a second support substrate having a cavity defined therein and disposed on the first substrate at block 808. The method of manufacturing 800 provides a voltage variable material disposed on the first substrate and within the cavity of the second support substrate and electrically connected to the first electrode and the second electrode at block 810. The method of manufacturing 800 may end at block 812.

While the present disclosures references certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. An electrical circuit protection device comprising:
a first support substrate;
a first electrode and a second electrode formed on the first support substrate, the first electrode and the second electrode formed from a conductive material;
a first bonding pad disposed on the first and second electrode, the first bonding pad having a first cavity formed therein;
a second support substrate disposed on the first bonding pad, the second support substrate having a second cavity formed therein;
a voltage variable material disposed within the first cavity and the second cavity and electrically connected to the first electrode and the second electrode;
a second bonding pad disposed on the second support substrate; and
a third support substrate disposed on the second bonding pad;
wherein the first cavity and the second cavity define an empty space between the voltage variable material and the second support substrate.

2. The electrical circuit protection device of claim 1, wherein the first and second electrodes are co-planar, having a gap separating the first electrode from the second electrode.

3. The electrical circuit protection device of claim 2, wherein at least a portion of the voltage variable material extends into the gap separating the first electrode and the second electrode.

4. The electrical circuit protection device of claim 1, wherein the first electrode and the second electrode are formed from a metal selected from a group including copper, silver, nickel, aluminum, platinum, gold, and zinc.

5. The electrical circuit protection device of claim 1, wherein the first support substrate, the second support substrate, and the third support substrate include castellations on opposite edges of each of the first support substrate, the second support substrate, and the third substrate.

6. The electrical circuit protection device of claim 1, wherein the first bonding pad and the second bonding pad include castellations on opposite edges of the first bonding pad and the second bonding pad.

7. The electrical circuit protection device of claim 1, wherein the first support substrate, the second support substrate, and the third substrate are formed from an electrically insulating material selected from a group including FR-4 epoxy, polyimide, and ceramic.

8. The electrical circuit protection device of claim 1, wherein the first electrode and the second electrode include a pair of outer terminations adapted for connection to an electrical circuit, the pair of outer terminations being electrically connected to the first electrode and the second electrode.

9. A method for forming an electrical circuit protection device comprising:
providing a first support substrate;
providing a first electrode and a second electrode formed on the first support substrate, the first electrode and the second electrode formed from a conductive material;
providing a first bonding pad disposed on the first and second electrode, the first bonding pad having a first cavity formed therein;
providing a second support substrate disposed on the first bonding pad, the second support substrate having a second cavity formed therein;
providing a voltage variable material disposed within the first cavity and the second cavity and electrically connected to the first electrode and the second electrode;
providing a second bonding pad disposed on the second support substrate; and
providing a third support substrate disposed on the second bonding pad;
wherein the first cavity and the second cavity define an empty space between the voltage variable material and the second support substrate.

10. The method of claim 9, further comprising providing a gap between the first electrode and the second electrode, wherein at least a portion of the voltage variable material extends into the gap.

11. The method of claim 9, wherein the first electrode and the second electrode are formed from a metal selected from a group including copper, silver, nickel, aluminum, platinum, gold, zinc and alloys thereof and the first support substrate, the second support substrate, and the third support substrate are formed from an electrically insulating material selected from a group including FR-4 epoxy, polyimide, and ceramic.

12. The method of claim 9, further comprising:
providing a castellation on opposite edges of each of the first support substrate, the second support substrate, and the third support substrate; and
providing a castellation on opposite edges of the first bonding pad and the second bonding pad.

13. The method of claim 9, further comprising providing a pair of outer terminations adapted for connection to an electrical circuit, the pair of outer terminations being electrically connected to the first and second electrodes, respectively.

14. A device for electrical circuit protection, comprising:
a first support substrate;
a first electrode and a second electrode formed on the first support substrate, the first electrode and the second electrode formed from a conductive material;
a second support substrate having a cavity defined therein and disposed on the first support substrate; and
a voltage variable material (VVM) disposed on the first substrate and within the cavity of the second support substrate, wherein the VVM is electrically connected to the first electrode and the second electrode;

wherein the cavity defines an empty space between the voltage variable material and the second support substrate, the cavity extending entirely through the second support substrate.

15. The device of claim 14, wherein the cavity of the second support substrate is configured to shield the VVM from contact and compression by the second support substrate.

16. The device of claim 14, wherein the first support substrate and the second support substrate are formed from an electrically insulating material selected from a group including FR-4 epoxy, polyimide, and ceramic.

17. The device of claim 14, wherein the first support substrate includes a pair of outer terminations adapted for connection to an electrical circuit, the pair of outer terminations being electrically connected to the electrode.

18. The device of claim 14, further including one or more castellations on opposite edges of each of the first support substrate, the second support substrate, and a third support substrate.

* * * * *